「(12) United States Patent
Knoedgen

(10) Patent No.: US 9,263,097 B2
(45) Date of Patent: Feb. 16, 2016

(54) ON-CHIP VOLTAGE GENERATION FOR A PROGRAMMABLE MEMORY DEVICE

(71) Applicant: Dialog Semiconductor GmbH, Kirchheim/Teck-Nabern (DE)

(72) Inventor: Horst Knoedgen, Munich (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 14/250,413

(22) Filed: Apr. 11, 2014

(65) Prior Publication Data

US 2015/0078059 A1 Mar. 19, 2015

(30) Foreign Application Priority Data

Sep. 17, 2013 (EP) .................................... 13184783

(51) Int. Cl.
*G11C 5/14* (2006.01)
*G11C 17/16* (2006.01)
*G11C 17/18* (2006.01)
*G11C 17/00* (2006.01)

(52) U.S. Cl.
CPC ............... *G11C 5/147* (2013.01); *G11C 17/00* (2013.01); *G11C 17/16* (2013.01); *G11C 17/18* (2013.01)

(58) Field of Classification Search
CPC ........ G11C 5/147; G11C 17/00; G11C 17/16; G11C 17/18
See application file for complete search history.

(56) References Cited

U.S. PATENT DOCUMENTS

| 5,774,406 | A | * | 6/1998 | Kowshik ...................... 365/226 |
| 6,144,247 | A | | 11/2000 | Kim et al. |
| 6,150,868 | A | | 11/2000 | Kim et al. |
| 6,346,846 | B1 | * | 2/2002 | Bertin et al. .................. 327/525 |
| 7,170,299 | B1 | * | 1/2007 | Anand et al. .................. 324/550 |
| 7,345,903 | B2 | * | 3/2008 | Nakano et al. .................. 365/96 |
| 7,388,770 | B2 | * | 6/2008 | Namekawa et al. ............ 365/94 |
| 7,613,062 | B2 | * | 11/2009 | Nakano et al. ............. 365/225.7 |
| 7,791,973 | B2 | * | 9/2010 | Sumi et al. ................. 365/225.7 |
| 7,924,598 | B2 | * | 4/2011 | Hase et al. .................... 365/100 |
| 8,248,865 | B2 | * | 8/2012 | Kaku ....................... 365/189.09 |
| 2006/0193163 | A1 | * | 8/2006 | Ito ................................. 365/149 |
| 2008/0186789 | A1 | | 8/2008 | Sumi et al. |
| 2010/0110750 | A1 | * | 5/2010 | Namekawa ..................... 365/96 |

OTHER PUBLICATIONS

European Search Report, 13184783.2-1806, Mailed: Mar. 7, 2014.

* cited by examiner

*Primary Examiner* — Vanthu Nguyen
(74) *Attorney, Agent, or Firm* — Saile Ackerman LLC; Stephen B. Ackerman

(57) ABSTRACT

The programming of programmable memory devices, e.g. one-time programmable (OTP) memory device is presented. In particular, efficient methods and systems for generating the supply voltage for programming a programmable memory device are described. A controller configured to control the programming of a data word into a programmable memory device is described. The controller is configured to set one or more digital control signals for programming the data word into the programmable memory device. Furthermore, the controller is configured to, subsequent to setting the one or more digital control signals, increasing a device supply voltage for the programmable memory device from a default operation level to a programming level.

15 Claims, 6 Drawing Sheets

ON-CHIP VOLTAGE GENERATION FOR A PROGRAMMABLE MEMORY DEVICE

TECHNICAL FIELD

The present document relates to the programming of programmable memory devices, e.g. one-time programmable (OTP) memory device. In particular, the present document relates to efficient methods and systems for generating the supply voltage for programming a programmable memory device.

BACKGROUND

OTP memory devices, which may also be referred to as programmable read-only memory (PROM), are used in various different applications to provide flexible means for storing program code or other data (e.g. calibration data). By way of example, OTP memory devices may be provided in conjunction with a controller on an integrated circuit (IC). In a particular example, OTP memory may be used on a driver circuit for a solid state lighting device (e.g. an Light Emitting Diode, LED, lamp) to store calibration data, which is determined and programmed at the end of the manufacturing process of such a solid state lighting device.

An OTP memory device typically comprises a plurality of pins which have different functions for the programming phase (when programming the OTP memory device to store data) and/or for the reading phase (when providing the stored data during operation of the IC which comprises the OTP memory device). A particular one of these pins is the supply voltage VPP pin (also referred to as the OTP supply voltage pin, or more generally to the device supply voltage pin). The OTP supply voltage VPP which may be applied to the OTP memory device typically takes on at least two different values: a read level (e.g. 1.5V) which is used during normal operation (i.e. during the reading phase) of the OTP memory device for reading the data which has been stored in the OTP memory device, and a programming level (e.g. 7.5V) which is used during the programming phase for allowing the OTP memory device to be programmed.

SUMMARY

The present document describes methods and corresponding circuits for providing the multi-level OTP supply voltage VPP for an OTP memory device in a cost efficient manner, while preventing an overvoltage at the OTP memory device. In particular, the methods and circuits of the present document allow for the generation of the multi-level OTP supply voltage VPP on-board, without the need of external components. As a consequence, the number of pins of an IC comprising the OTP memory device may be reduced, thereby reducing the cost of the IC.

According to an aspect, a controller configured to control the programming of one or more data words into a programmable memory device is described. The programmable memory device may comprise or may be a one-time programmable (OTP) memory device. Alternatively or in addition, the programmable memory device may comprise or may be an Electrically Erasable Programmable Read-Only Memory (EEPROM) or a Flash memory device. In particular, the programmable memory device may comprise or may be a memory device which can be programmed through the application of an increased (i.e. a higher than normal) supply voltage. Alternatively or in addition, the programmable memory device may comprise or may be a memory device which can be programmed through the generation of a tunnel through a transistor of the memory device. Such a tunnel may be generated by a programming current flowing through the transistor as a result of an increased supply voltage. The programmable memory device may possibly be erasable, e.g. through the application of ultraviolet (UV) radiation.

The controller may be comprised within an integrated circuit which also comprises the programmable memory device. The controller may be configured to set one or more control signals, notably digital control signals, for programming the (one or more) data word into the programmable memory device. In particular, the controller may be configured to set the one or more control signals (e.g. all control signals) for the programmable memory device, such that programming of the data word into the programmable memory device occurs, directly when increasing a device supply voltage (also referred to as an OTP supply voltage in case of an OTP memory device) to a programming level, without the need for further modifications of the configuration of the programmable memory device. As such, the controller may be configured to set the one or more control signals such that the programmable memory device is fully configured for the writing of the data word into the programmable memory device.

The control signals may be signals at a logic voltage level. The logic voltage level may correspond to a default operation level of the device supply voltage for the programmable memory device. The one or more control signals may carry digital and/or binary information towards the programmable memory device. The programmable memory device may comprise dedicated one or more pins for sensing the one or more control signals, respectively. The one or more control signals may prepare the programmable memory device logically and/or digitally for the programming of the data word.

In particular, the one or more control signals may comprise a pulse width control signal configured to (digitally) control a default programming time interval for programming the code word. In other words, according to a specification of the programmable memory device, the pulse width control signal (also referred to as the PWE signal in the present document) may be used to control a length of the programming time interval, i.e. a length of the time interval during which the data word is programmed into a section of the programmable memory device.

Alternatively or in addition, the one or more control signals may comprise a data signal indicative of the code word which is to be programmed. Furthermore, the one or more control signals may comprise an address signal indicative of a location or a section within the programmable memory device which is to be programmed.

The controller may be further configured to increase the device supply voltage for the programmable memory device from the default operation level to the programming level. The increase of the device supply voltage is performed subsequent to the setting of the one or more digital control signals (i.e. subsequent to the logical and/or digital preparation of the programmable memory device for programming). As such, it is ensured that no logical and/or digital modifications occur within the programmable memory device when the device supply voltage is at programming level, i.e. when the data word is being written into the programmable memory device. By doing this, it is ensured that the programmable memory device acts as a fixed resistive load. In other words, by first setting the one or more control signals of the programmable memory device, prior to increasing the device supply voltage, load transients (at the beginning and at the end of a programming phase) may be avoided. This relaxes the requirements with regards to the regulation of the device supply voltage, thereby allowing the use of cost efficient and/or on-chip voltage regulators.

The controller may further be configured to decrease the device supply voltage from the programming level to the default operation level, subsequent to a programming time interval. The controller may be configured to select the programming time interval (also referred to in the present document as the actual programming time interval), such that the code word is reliably programmed into the (section of) the programmable memory device. This may be achieved by ensuring that an electrical power which is provided to the programmable memory device within the programming time interval is sufficiently high for programming the code word. The electrical power which is provided to the programmable memory device typically depends on the device supply voltage and on a load current which is drawn by the programmable memory device during the programming time interval. In particular, the controller may be configured to select the programming time interval to be longer than the default programming time interval. This increased programming time interval may be selected to account for a ramp-up and/or ramp-down (and/or for the slew rate) of the device supply voltage within the programming time interval.

The controller may be configured to modify the one or more digital control signals (only) subsequent to decreasing the device supply voltage. In particular, the controller may be configured to maintain the one or more control signals (e.g. all control signals) unchanged during the programming time interval. In particular, the controller may be configured to set the pulse width control signal prior to increasing the device supply voltage and to reset the pulse width control signal subsequent to decreasing the device supply voltage (and to maintain the pulse width control signal unchanged when the device supply voltage is increased). By doing this, it is ensured that the programmable memory device acts as a fixed resistive load during the entire programming time interval.

According to a further aspect, an integrated circuit is described. The integrated circuit (also referred to as a chip) comprises an programmable memory device. The integrated circuit may e.g. be used to provide a driver circuit for a solid state lighting (e.g. LED), SSL, device, which is configured to provide an LED array with electrical power (e.g. drawn from a mains supply). As such, the integrated circuit may be comprised within an SSL assembly (e.g. a lamp or light bulb). The on-chip programmable memory device may be used e.g. to store calibration data for the SSL device.

Furthermore, the integrated circuit may comprise a controller. The controller may be configured to control the programming of one or more data words into the programmable memory device. In particular, the controller may be configured as described in the present document. In addition, the integrated circuit may comprise a device supply voltage provisioning circuit (also referred to as an OTP supply voltage provisioning circuit in the case of an OTP memory device) which is configured to provide the device supply voltage for the programmable memory device at different voltage levels (notably at the default operation level and at the programming level, wherein the programming level is higher than the default operation level, e.g. 2, 3, 4 or more times higher).

The device supply voltage provisioning circuit may comprise a voltage regulator configured to derive the device supply voltage from an integrated circuit (IC) supply voltage. The device supply voltage may be derived subject to a reference voltage. For this purpose, the voltage regulator may comprise an operational amplifier configured to compare at an input of the operational amplifier a feedback voltage, which is indicative of (or which corresponds to) the device supply voltage, to the reference voltage. Furthermore, the voltage regulator may comprise a pass device controlled by an output of the operational amplifier. The pass device may be arranged to couple the IC supply voltage to a device supply voltage pin (or connector) (also referred to as an OTP supply voltage pin, in case of an OTP memory device) of the programmable memory device via a variable on-resistance of the pass device. The on-resistance of the pass device may be controlled by the output of the operational amplifier (which may be coupled to a gate of the pass device). The pass device may comprise a transistor, e.g. a MOS transistor.

The controller may be configured to set the reference voltage to the programming level. As a result of this, the device supply voltage provisioning circuit (and in particular the voltage regulator) may provide the device supply voltage at the programming level to the programmable memory device. In a similar manner, the controller may be configured to set the reference voltage to the default operation level to reduce the device supply voltage to the default operation level.

Due to the fact that the controller controls the programmable memory device such that the programmable memory device acts as a fixed resistive load during programming of the one or more data words (and in particular at the beginning and at the end of the programming time intervals for programming the one or more data words), the voltage regulator for providing the device supply voltage at the programming level may be implemented in a cost efficient manner. In particular, the voltage regulator may be implemented on-chip, i.e. on the integrated circuit. Furthermore, the voltage regulator may be implemented without the need for external energy storage and/or decoupling components. In particular, the voltage regulator may be a capacitor-less voltage regulator.

The voltage regulator may comprise an interruption switch configured to decouple the IC supply voltage from the device supply voltage pin (e.g. by opening the pass device). The controller'may be configured to control the interruption switch to decouple the IC supply voltage from the device supply voltage pin to decrease the device supply voltage. This may occur at the end of the programming time interval. By making use of such an interruption switch, the speed of the ramp-down of the device supply voltage from the programming level to the default operation level may be increased, thereby shortening the length of the programming time interval.

The device supply voltage provisioning circuit may comprise default operation voltage provisioning means configured to provide a device supply voltage at a default operation level. The default operation voltage provisioning means may be configured to derive the device supply voltage at the default operation level from a logic voltage regulator of the integrated circuit. As such, the default operation voltage provisioning means may be configured to provide the device supply voltage at the default operation level in a cost efficient manner.

The default operation voltage provisioning means may comprise a resistor for coupling a device supply voltage pin of the programmable memory device with the logic voltage regulator. Furthermore, the default operation voltage provisioning means may comprise a bypass switch in parallel to the resistor and configured to bypass the resistor. The controller may be configured to control the bypass switch to bypass the resistor for providing the device supply voltage at the default operation level. By doing this, the device supply voltage at the default operation level may be provided in an energy efficient manner. On the other hand, the resistor may be used during the programming phase, when the device supply voltage is at programming level, for stabilization purposes. In particular, the resistor may provide the voltage regulator (e.g. an operation amplifier of the voltage regulator) with an additional load during the programming phase, thereby increasing the stability of the provisioning of the device supply voltage at programming level. Furthermore, when the voltage regulator is switched off, the device supply voltage may drop to the level of a logic voltage (which may correspond e.g. to the default operation level). The default operation voltage provisioning means may be configured to provide the logic voltage (e.g. via the resistor) to the OTP device.

The controller may be configured to control the device supply voltage provisioning circuit such that a device supply voltage at the default operation level is generated using the default operation voltage provisioning means. Furthermore, the controller may be configured to control the device supply voltage provisioning circuit such that a device supply voltage at the programming level is generated using the voltage regulator. By combining different provisioning means, the device supply voltage can be provided in an energy efficient manner at different voltage levels.

According to a further aspect, a method for controlling programming of a data word into a one-time programmable, OTP, memory device is described. The method comprises setting one or more (digital) control signals for programming the data word into the programmable memory device. Furthermore, the method comprises, subsequent to setting the one or more (digital) control signals, increasing a device supply voltage for the programmable memory device from a default operation level to a programming level.

According to a further aspect, a software program is described. The software program may be adapted for execution on a processor and for performing the method steps outlined in the present document when carried out on the processor.

According to another aspect, a storage medium is described. The storage medium may comprise a software program adapted for execution on a processor and for performing the method steps outlined in the present document when carried out on the processor.

According to a further aspect, a computer program product is described. The computer program may comprise executable instructions for performing the method steps outlined in the present document when executed on a computer.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

As outlined in the introductory section, the present document relates to the programming of a programmable memory device. In particular, the present document relates to efficient means for generating the multi-level supply voltage VPP for a programmable memory device. In the following, the systems and methods are described in the context of an OTP memory device. It should be noted, however, that the systems and methods are applicable to programmable memory device in general, in particular, to programmable memory device which can be programmed by application of an increased supply voltage.

A typical OTP memory device is initially provided with all bits of the OTP memory device reading as "1" or as "0". Programming a bit (also referred to as a fuse bit or as an antifuse bit) causes the bit to change its value from "1" to "0" or from "0" to "1". The OTP memory can be programmed just once, e.g. by the irreversible process of destroying the fuse of a bit. Destroying a fuse opens a connection and programming an antifuse closes a connection.

A bit cell (which is implemented by a thin oxide transistor) may be programmed by applying a high voltage pulse, at a voltage level which is typically not encountered during normal operation, across the gate and substrate of the thin oxide transistor. This high voltage pulse may be at the so called programming voltage, which may e.g. be around 6V for a 2 nm thick oxide (or around 7.5V for the examples described in the present document). The high voltage pulse may be generated by increasing the OTP supply voltage to the programming voltage.

The voltage at the programming level breaks down the oxide between gate and substrate. The positive voltage on the transistor's gate may form an inversion channel in the substrate below the gate, causing a tunneling current to flow through the oxide. The current may produce additional traps in the oxide, increasing the current through the oxide and ultimately melting the oxide and forming a conductive channel from gate to substrate. The current which is required to form the conductive channel may be around 100 μA/100 nm2 and the breakdown may occur in approximately 100 μs or less. As such, when programming a bit cell, the increased voltage at programming level should be applied for a predetermined minimum time interval, in order to ensure a reliable programming of the bit cell of the OTP memory device.

Figure 1:
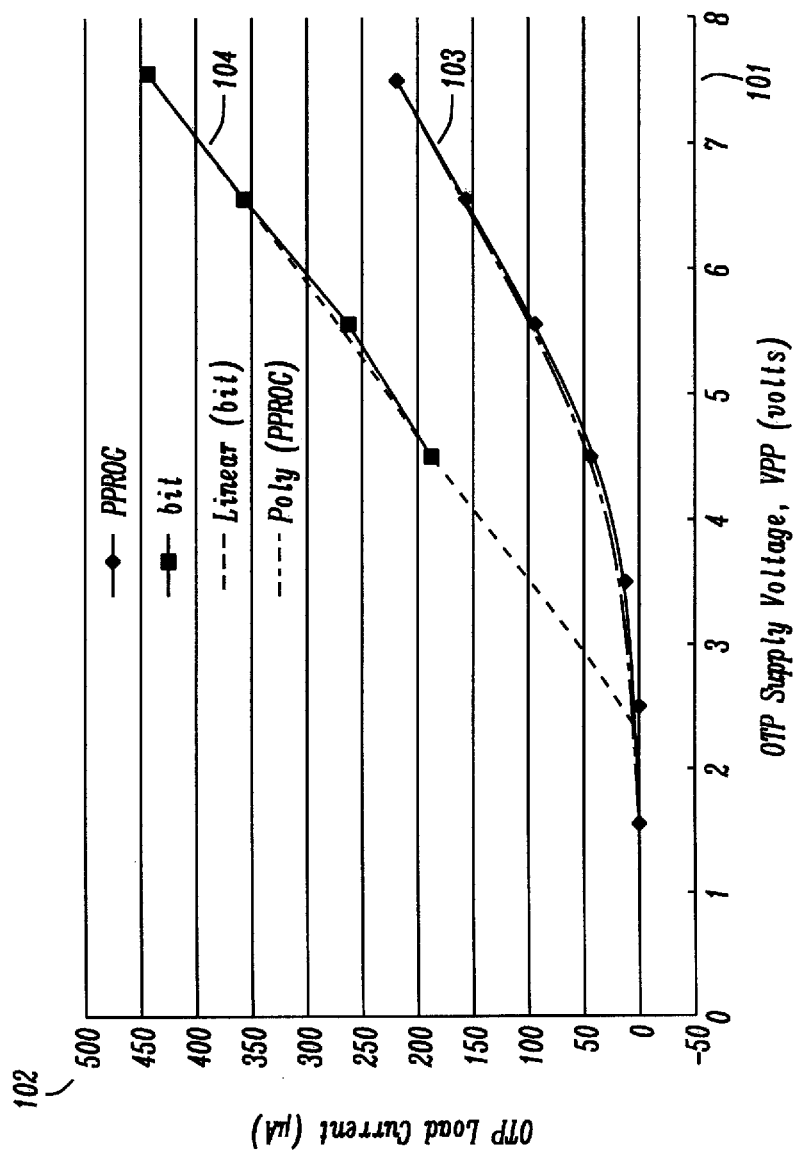
FIG. 1 illustrates example currents drawn by an OTP memory device in dependence of the OTP supply voltage VPP.

FIG. 1 shows example programming currents of an OTP memory device. In particular, FIG. 1 shows the current I 102 which is drawn by the OTP memory device as a function of the OTP supply voltage VPP 101 which is applied to the OTP memory device. It can be seen that the current I 102 increases with increasing OTP supply voltage VPP 101. The total current I 102 drawn by the OTP memory device comprises a first component 103 which occurs when setting the OTP memory device to programming mode (e.g. when setting a PPROG signal). This first component 103 may be referred to as the PPROG current. Furthermore, the current I 102 comprises a second component which depends on the number of bits which are to be programmed, e.g. on the number of transistors which are to be fused.

In particular, FIG. 1 illustrates the characteristics of an example OTP memory device, e.g. an OTP memory device used on a 0.13 μ technology (other technologies are also possible). The load current 102 for an OTP supply voltage at programming level (e.g. VPP=7.5V) comprises two components: a fixed PPROG current 103 and a bit-dependent current 104 which is dependent on the number of bits (e.g. the number of "1"s) in the byte which is to be programmed. As shown by the graph of FIG. 1 the currents 103, 104 tend towards zero, as the OTP supply voltage VPP is reduced towards the default operation level (in this case VPP=1.5V). FIG. 1 shows the OTP load current I 102 in uA (ordinate) comprising the fixed PPROG current 103 and the bit-dependent current 104, as a function of the OTP supply voltage VPP 101 in V (abscissa), when the OTP memory device is in programming mode (e.g. when a PPROG control signal is set).

Hence, it can be observed that when the OTP memory device is in programming mode, the load current 102 of the OTP memory device is a function of the OTP supply voltage VPP 101 and does not produce substantial high frequency dynamic current spikes. The total programming current 102 which is required for programming a byte of data is the result of the number of bits which are to be programmed (i.e. the number of bit values which are to be changed from the default value to the programmed value) plus the fixed PPROG current. As an example, programming the byte 01101011b having a total of 5 "1"s at VPP=7.5V leads to a load current 102 of approximately (5*450 μA)+230 μA=2.48 mA (see FIG. 1).

Figure 2A:
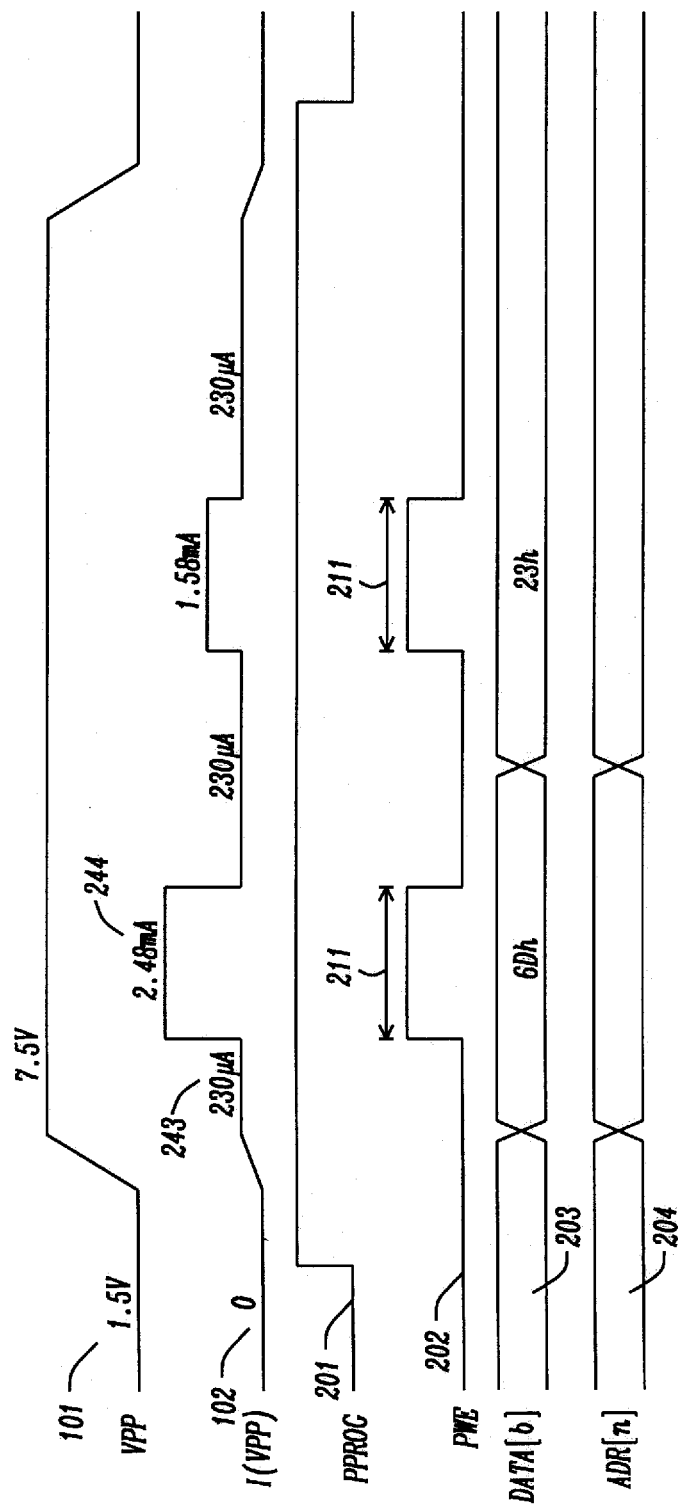
FIG. 2a shows an example signal or timing diagram for programming an OTP memory device.

FIG. 2a shows a typical signal or timing diagram for programming an OTP memory device. In particular, FIG. 2a shows the OTP supply voltage 101. In order to allow for the programming of the OTP memory device, the OTP supply voltage 101 is increased from the read level or default operation level (1.5V in the illustrated example) to the programming level (7.5V in the illustrated example). Furthermore, a PPROG signal 201 (e.g. a binary or digital signal) may be set to inform the OTP memory device that the OTP memory device (or parts thereof) is to be programmed. The PPROG signal 201 may be used to set the OTP memory device to programming mode. An ADR (address) signal 204 may identify the section of the OTP memory device (e.g. a particular byte) which is to be programmed, and the DATA signal 203 may carry the data or data word (e.g. a particular byte value) which is to be programmed into the OTP memory device. A PWE signal 202 (e.g. a binary signal) may define the actual programming time interval, in order to isolate (in time) the different sequential data words in the DATA signal 203. As such, the PWE signal 202 (also referred to as the pulse width control signal 202) may be used to control the length of the programming time interval 211 (also referred to as the default programming time interval 211)

FIG. 2a also illustrates the load current I 102 drawn by the OTP memory device. It can be seen that as soon as the OTP supply voltage VPP 101 is increased towards the programming level, the load current I 102 increases to the fixed PPROG current component 243 (See FIG. 1-103) (if the PPROG signal 201 is set, i.e. if the OTP memory device is set to programming mode). When programming a particular data word into the OTP memory device (within the programming time intervals 211), the load current I 102 increases by the additional bit-dependent component to I(VPP) level 244 (See FIG. 1-104). As such, FIG. 2a shows the load transients (at the beginning and at the end of the programming time intervals 211) which are caused by the programming of bits within the OTP memory device.

In other words, FIG. 2a illustrates the programming of an OTP memory device. In particular, FIG. 2a shows the OTP supply voltage VPP 101 together with the digital control inputs PPROG 201 and PWE 202 for the OTP memory device. The PPROG signal 201 may be a control signal indicating that the OTP memory device should be submitted to an OTP supply voltage 101 at programming level. As such, the PPROG signal 201 may initiate the programming phase. The PWE signal 202 may be a control signal indicating that the data at the DATA signal 203 is activated, i.e. is ready for programming. As such, the PWE signal 202 may configure the OTP memory device for programming. The programming of the individual bits is typically controlled by the PWE signal 202. The PWE signal 202 typically causes the data words (comprised within the DATA signal 203) to be "burned" into a block of the OTP memory device (which is identified by the ADR signal 204). As a result of this, the load current I 102 increases/decreases, thereby generating a dynamic loading effect on the supply of the OTP supply voltage VPP 101.

The load transients at the borders of the time intervals 211 typically affect the OTP supply voltage VPP 101. In particular, the OTP supply voltage VPP 101 may drop or increase, subsequent to load transients (not shown in FIG. 2a). An OTP supply voltage VPP 101 which exceeds a pre-determined voltage limit may lead to a destruction of the OTP memory device. Hence, the OTP supply voltage 101 may need to be regulated using relatively costly high performance regulators.

In the present document, it is proposed to modify the sequence of the setting of the different control signals 201, 202 and of the increasing/decreasing of the OTP supply voltage VPP 101 in order to avoid undesirable load transients. As a consequence, cost efficient voltage regulators may be used to provide the OTP supply voltage VPP 101. Such cost efficient voltage regulators may be implemented on-chip, thereby reducing the number of pins of an IC comprising the OTP memory device.

Figure 2B:
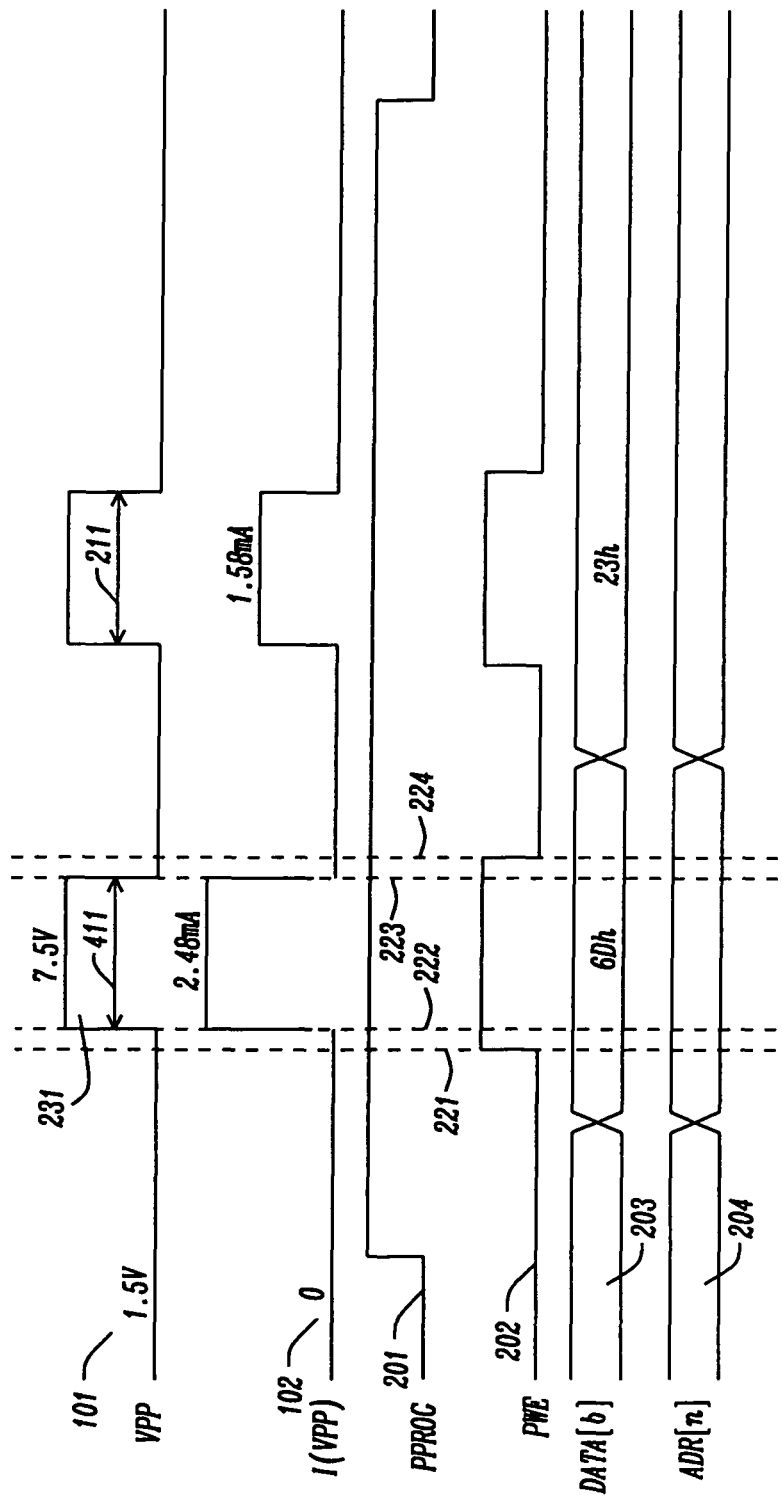
FIG. 2b shows another example signal or timing diagram for programming an OTP memory device.

FIG. 2b shows an example sequence of signals which may be used to program an OTP memory device. It can be seen that in the illustrated example, the supply voltage 101 is only increased subsequent to having set up a code word which is to be programmed (via the DATA signal 203). In particular, it can be seen that the control signal PWE 202 is set at time instant 221, thereby unlocking the code word which is carried by the DATA signal 203, and thereby allow the code word to be written to the OTP memory device at the address indicated by the ADR signal 204. In other words, the OTP memory device may be prepared such that, if the OTP supply voltage VPP is at the programming level, the data words is written to the OTP memory device. In yet other words, the OTP memory device may be prepared such that the only step or the only component which is missing for writing the data word into the OTP memory device is an OTP supply voltage VPP at the programming level. As a result of these preparatory steps, the OTP memory device may be viewed as a fixed load to the supply of the OTP supply voltage, wherein the fixed load is defined by the number of bits comprised within the data word that is to be written.

Subsequent to setting the load (e.g. by setting the PWE signal 202), the supply voltage 101 is increased from the read level (at 1.5V) to the programming level 7.5V at time instant 222 (which is subsequent to time instant 221). As a result of increasing the OTP supply voltage VPP 101 to the programming level, the load current 102 (which depends to the number of bits to be programmed) is drawn. This load current 102 is substantially constant throughout the actual programming time interval 411 (starting at time instant 222). The actual programming time interval 411 may be different from the default programming time interval 211 in the sequence of FIG. 2a. In particular, due to the modified sequence, the actual programming time interval 411 may be (slightly) longer than the default programming time interval 211 (as a result of the ramp-up of the OTP supply voltage 101 within the actual programming time interval 411).

The programming of the OTP block is terminated by reducing the OTP supply voltage VPP 101 from the programming level back to the read level at time instant 223 (subsequent to the time instant 222). Only after having reduced the OTP supply voltage 101, the control signal PWE 202 is set to zero (at time instant 224) to terminate the programming operation (e.g. to disconnect or decouple the OTP block from the data word which is to be programmed).

By changing the order of the application of the OTP supply voltage 101 and of the setting of the digital control signals PPROG 201 and/or PWE 202, such that the digital control signals 201, 202 are set prior to and remain constant during a programming pulse 231 of the OTP supply voltage 101, the loading of the OTP supply voltage VPP 101 is transformed into a static, constant load. As can be seen from FIG. 2b, the application and removal of the PWE signal 202 occurs before (at time instant 221) and after (at time instant 224) the increase/decrease of the OTP supply voltage VPP 101 for generating the programming pulse 231.

Hence, when programming an on-chip OTP memory device, the OTP supply voltage VPP 101 may be increased to the programming level prior to operation of the digital control signal 202 that programs a data word. This results in a modulated load at the OTP supply voltage VPP 101 (see FIG. 2a). If the supply voltage is generated on-chip, then the supply voltage generation unit must accommodate for the switching load transients (e.g. by appropriate regulation means). Alternatively or in addition, an external decoupling capacitor may be used to stabilize the OTP supply voltage VPP 101 subject to load transients. This leads to increased costs for programming on-chip OTP memory devices.

On the other hand, an on-chip regulator (without external decoupling capacitor) for fixed load currents may be implemented in a cost efficient manner. In particular, it may be achieved in a cost efficient manner that the OTP supply voltage VPP 101 at the OTP memory device meets the VPP voltage specifications of the OTP memory device. A fixed load current 102 may be provided by changing the sequence of the digital control of the OTP memory device, such that the increased OTP supply voltage VPP (at programming level) is applied only after the bit programming setup has occurred (see FIG. 2b). This results in the load current 102 which is drawn by the OTP memory device to be constant. In other words, instead of keeping the OTP supply voltage VPP 101 at programming level and using the control signal PWE 202 to control the programming time intervals 211, it is proposed to switch the OTP supply voltage 101 between read level and programming level to generate programming pulses 231 for programming data words. By doing this, the requirements with regards to the regulation of the OTP supply voltage VPP 101, i.e. the LDO (Linear Dropout regulator)/OPAMP (operational amplifier) performance requirements, are relaxed.

To further reduce the requirements with regards to the regulation of the OTP supply voltage VPP 101, the OTP memory device may be programmed bit-by-bit (i.e. 1 bit at a time). As a consequence, the load current 102 during programming is reduced.

As a result of changing the sequence of the signals/voltages which are applied to the OTP memory device, a cost efficient on-chip voltage regulator/OPAMP may be used to generate the supply voltage 101. Furthermore, no external decoupling capacitor is required, i.e. capacitor-less OPAMPs may be used.

The OTP memory device may be programmed during operation of the chip or IC which comprises the OTP memory device. If the chip is supplied with a sufficient IC supply voltage Vcc, which is higher than the OTP supply voltage (e.g. Vcc=9V for VPP=7.5V), the regulator/OPAMP for the OTP supply voltage 101 typically has sufficient headroom to allow for the use of a P-channel pass device for the voltage regulator. Typically, there are no high frequency dynamic load current changes which may lead to loop stability problems.

A further possibility may be to replace the voltage regulator/OPMAP with a switch to the IC supply voltage Vcc, if the IC supply voltage Vcc can be reduced to the programming level of the OTP supply voltage VPP. In this case, the OTP supply voltage may be increased to programming level by closing the switch, thereby coupling an OTP supply voltage pin of the OTP memory device with the IC supply voltage.

Figure 3:
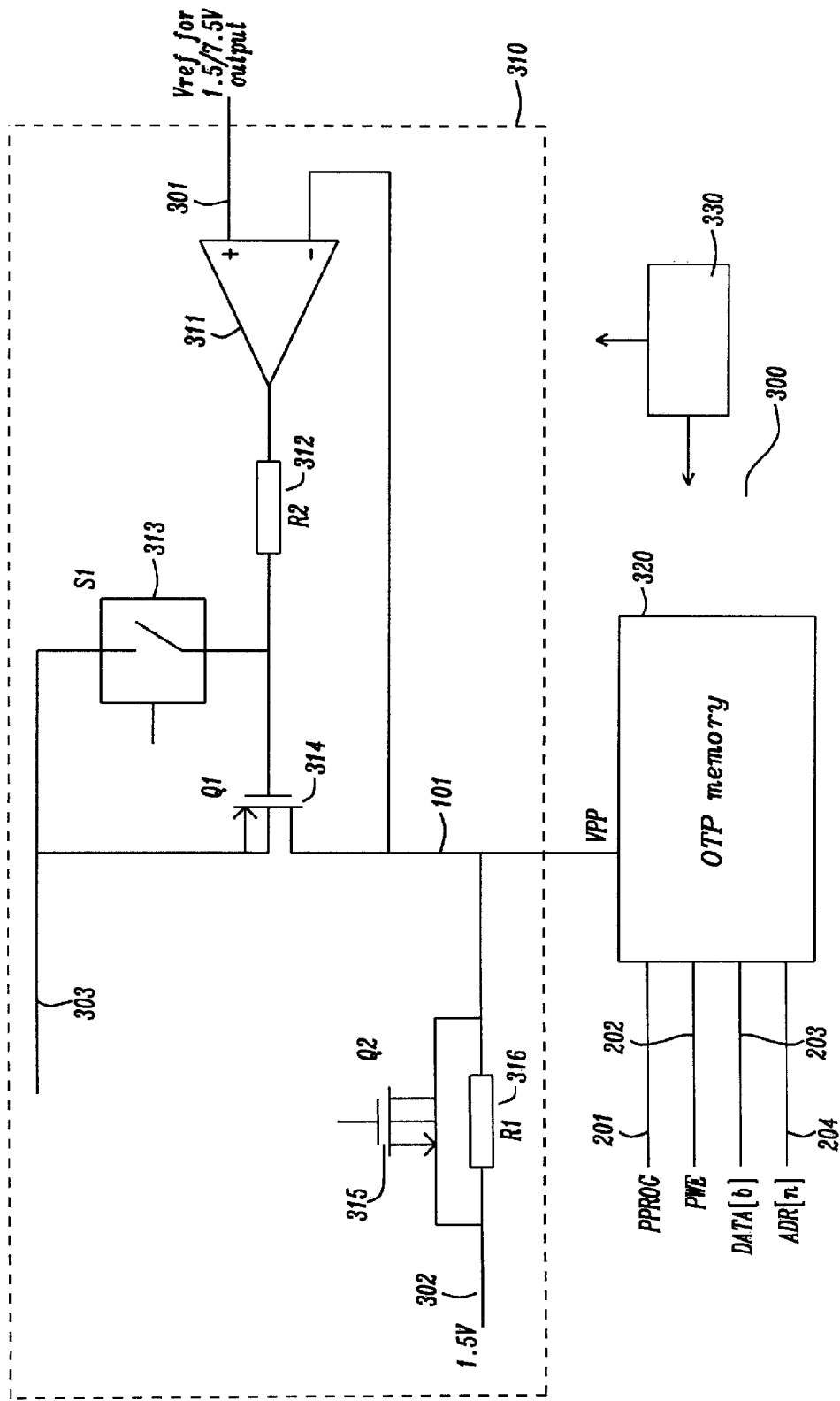
FIG. 3 shows a block diagram of an example circuit for generating the multi-level OTP supply voltage VPP for an OTP memory device.

FIG. 3 shows an example circuit 300, e.g. an example integrated circuit. The circuit 300 comprises an OTP supply voltage provisioning circuit 310 for providing the OTP supply voltage VPP 101 to an OTP supply voltage pin of the OTP memory device 320. The OTP memory device 320 comprises a plurality of different pins (or connections), e.g. the pin for the OTP supply voltage VPP 101, a pin for the PPROG control signal 201, a pin for the PWE control signal 202, a pin for the DATA signal 203 and/or a pin for the ADR signal 204.

The OTP supply voltage provisioning circuit 310 for generating the OTP supply voltage VPP 101 comprises a voltage regulator comprising an OPAMP (operational amplifier) 311 and a pass device Q1 (e.g. a P-channel metal oxide semiconductor, MOS, transistor) 314. A source of the pass device 314 is coupled to the IC supply voltage Vcc 303 (which may e.g. be in the range of 12V or 9V). The OTP supply voltage provisioning circuit 310 and the OTP memory device 320 may be implemented on a joint chip 300. Furthermore, the chip 300 may comprise a controller 330 which is configured to control the programming process of the OTP memory device 320. In particular, the controller 330 may be configured to control a reference voltage Vref 301 which is set at the input of the OPAMP 311 (and to thereby control the level of the OTP supply voltage VPP 101). Furthermore, the controller 330 may be configured to set (and reset) the OTP control signals 201, 220, the DATA signal 203 and/or the ADR signal 204 for programming of the OTP memory device 320.

The OPAMP 311 and the feedback loop from the drain of the pass device 314 (and/or from the OTP supply voltage pin of the OTP memory device 320) to the second (negative) input of the OPAMP 311 regulates the OTP supply voltage VPP 101 such that the OTP supply voltage VPP 101 corresponds to the reference voltage Vref 301 at the first (positive) input of the OPAMP 311. Hence, the controller 330 may be configured to switch the reference voltage Vref 301 between the read level (e.g. 1.5V) and the programming level (e.g. 7.5V) and to thereby control the OTP supply voltage VPP 101 to also switch between the read level (e.g. 1.5V) and the programming level (e.g. 7.5V). The resistor R2 312 between the output of the OPAMP 311 and the gate of the pass device 314 may be used for stabilization purposes. The OPAMP 311, the resistor 312 and the pass device 314 may be part of a voltage regulator for regulating the OTP supply voltage VPP 101.

Furthermore, the OTP supply voltage provisioning circuit 310 may comprise an interruption switch S1 313 which is arranged between the source and the gate of the pass device 314. The controller 330 may be configured to control the interruption switch 313. By closing (i.e. by turning on) the interruption switch 313, the pass device 314 may be opened, to interrupt the generation of the OTP supply voltage VPP 101 based on the IC supply voltage Vcc 303. This may be beneficial when providing the OTP supply voltage VPP 101 at read level via different means of the OTP supply voltage provisioning circuit 310. By way of example, the chip 300 may already comprise a voltage rail 302 at the read level (e.g. 1.5V). As such, it may be more efficient to use this voltage rail 302 for providing the OTP supply voltage VPP 101.

The controller 330 may be configured to first set the OTP data 203 and the OTP address 204 (in accordance to the sequence shown in FIG. 2b). Furthermore, other control signals (e.g. the PPROG signal 201 and/or the PWE signal 202 may be set.

The actual OTP programming may then be activated by changing the voltage regulator from its nominal voltage (e.g. 1.5V) to the programming voltage (7.5V), i.e. by changing the reference voltage Vref 301 from the read level to the programming level. Due to the fact that the control signals or digital signals 201, 202, 203, 204 at the OTP memory device 320 remain unchanged, the regulator/OPAMP 311, 314 is only submitted to a continuously increasing load (caused by a rising load current I 102 shown in FIG. 1). The regulator/OPAMP 311, 314 is not submitted to a decreasing load. As a result of this, voltage spikes may be avoided.

The programming may then be deactivated by changing the reference voltage Vref 301 back from programming level to read level and to thereby cause the OTP supply voltage VPP 101 to drop to read level. Alternatively or in addition, the interruption switch 313 may be closed, to open the pass device 314 and to thereby decrease the OTP supply voltage VPP 101. The load of the OTP memory device 320 only decreases subsequent to the reduction of the OTP supply voltage VPP 101, thereby removing the risk of OTP supply voltage spikes.

As outlined above, the load current drawn by the OTP memory devices depends on the number of bits, which are to be programmed. As illustrated in FIG. 3, the provision of the OTP supply voltage VPP at programming level can be implemented using a cost efficient regulator/OPAMP structure. As no digital switching or current spikes occur during the actual programming time interval 411, the dynamic performance requirements with regards to the regulator/OPAMP 311, 314 are relaxed. In particular, the OPAMP 311 can be implemented without capacitor.

The reduction of the OTP supply voltage VPP 101 from programming level to read level, i.e. the termination of the programming, may be achieved by reducing the reference voltage Vref 301 to the read level and by thereby regulating the OTP supply voltage VPP 101 to the read level. Alternatively, the output stage (i.e. the pass device 314) of the voltage regulator may be switched off using the interruption switch 313.

As indicated above, the OTP supply voltage VPP at read level may be provided by a separate voltage source 302 (e.g. by a digital logic regulator of the chip 300). The OTP supply voltage VPP 101 at read level may be stabilized using a resistor R1 316 between the OTP supply voltage VPP pin of the OTP memory device 320 and the voltage source 302. The voltage source 302 may also be configured to supply the voltage for generating the control and/or digital signals 201, 202, 203, 204 for the OTP memory device 320.

In the OTP supply voltage provisioning circuit 310 of FIG. 3, the switch Q2 315 is used to supply the OTP supply voltage VPP 101 at read level during normal operation. During the programming phase the switch Q2 320 may be turned off (i.e. opened). The resistor R1 316 may be used to keep the OTP supply voltage VPP 101 biased while the pass device Q1 314 and the switch Q2 315 are turned off (i.e. during the transition time between programming level and read level of the OTP supply voltage VPP 101). The voltage supply 302 may provide a positive current through the resistor 316 during programming.

The reference voltage Vref 301 for the operational amplifier 311 may be such that the output of the regulator (at the drain of the pass device 314) is regulated to the read level or to the programming level, when the interruption switch S1 313 is open. By closing the interruption switch S1 313, the transistor Q1 314 is turned off and the OTP supply voltage VPP 101 transitions back to the read level (via the resistor R1 316 and/or the switch Q2 315). The type of pass device 314 may depend on the technology of the chip 300 and/or on the head room provided by the chip/IC supply voltage Vcc 303. By way of example, the pass device 314 may also be implemented as an N-channel (MOS) transistor or as an NPN transistor.

Figure 4:
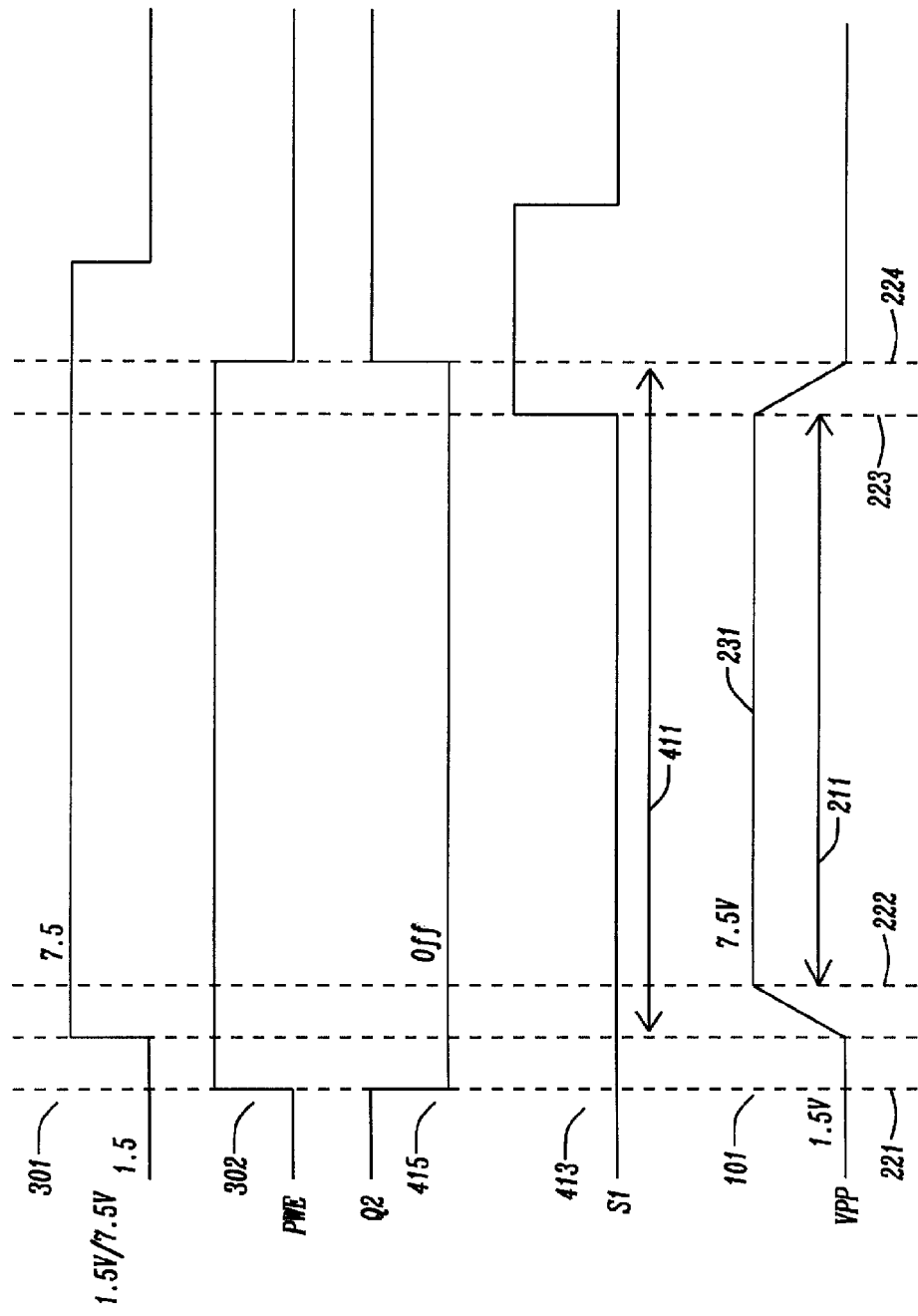
FIG. 4 shows an example signal or timing diagram for the example circuit of FIG. 3.

FIG. 4 illustrates an example signal or timing diagram which shows the sequencing of control/voltage signals for generating a programming pulse 231 of the OTP supply voltage VPP 101 using the OTP supply voltage provisioning circuit 310 of FIG. 3. It can be seen that by increasing the reference voltage Vref 301, the OTP supply voltage VPP 101 is brought up to the programming level. During programming the switch Q2 315 may be switched off (see control signal 415). The programming pulse 231 may be terminated by closing the interruption switch S1 313 (see control signal 413). The switch Q2 315 may be turned on again, subsequent to programming, in order to allow for an energy efficient provision of the OTP supply voltage VPP 101 at read level during normal operation. The reference voltage Vref 301 should be reduced prior to re-opening the interruption switch S1 313 (control signal 413), in order to avoid an undesired increase of the OTP supply voltage VPP 101.

As such, the OTP programming voltage regulator changes the OTP supply voltage VPP 101 from the read level to the programming level, at a time instant when no more switching occurs within the OTP memory device 320. As a consequence, the regulator is under resistive load without dynamic changes. The switching off of the programming may be achieved by opening or disconnecting (e.g. by opening the pass device 314) the output of the regulator from the OTP supply voltage pin of the OTP memory device 320, such that the OTP supply voltage VPP 101 drops to the read level. The resistor 316 may be used to stabilize the OTP supply voltage VPP 101. In this mode, the OTP supply voltage VPP pin may carry a relatively small leakage current. The current in the 1.5V regulator (also referred to as a default operation voltage regulator 302), i.e. in the regulator which provides the voltage at voltage source 302, e.g. the digital logic regulator, can be positive, allowing for positive clamping, push pull output or enough load. This current may be due to the coupling of the digital logic regulator and the OPAMP 311 via the resistor 316. Forced by the difference voltage, a current may flow through the resistor 316 and may force the logic voltage (e.g. 1.5 V) to higher values, if the load which is provided by the resistor 316 is not high enough.

Alternatively or in addition to using a resistor 316 between the default operation voltage regulator 302 (e.g. the digital logic regulator) and the OPAMP 311 output, a current source could be used. Furthermore, the OPAMP 311 (i.e. the voltage regulator 311, 314 for providing the OTP supply voltage) may be configured to reduce the voltage at the OTP supply voltage pin with a pre-determined slew rate (e.g. a relatively slow slew rate, i.e. a slew rate lower than a pre-determined slew rate threshold) from the programming level to the default operation level. The reduction of the voltage at the OTP supply voltage pin may occur before the end of the last programming pulse.

Figure 5:
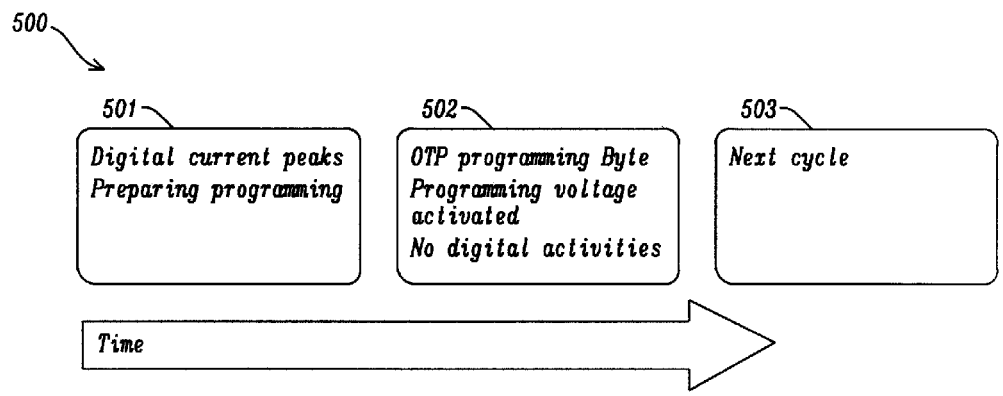
FIG. 5 shows an example sequence of steps for programming an OTP memory device.

FIG. 5 illustrates an example sequence 500 of steps which may be used to program a data word of an OTP memory device 320. In a first step 501, the programming of the data word into the OTP memory device 320 is prepared. In particular, the programming phase may be initiated by setting the PPROG signal 201, the DATA signal 203 (comprising the data word) may be set, the ADR signal 204 (indicating the section of the OTP memory device 320 which is to be programmed) may be set, and the PWE signal 202 which is typically used to control the programming time interval 211 is set. As such, digital current peaks which may be caused by the setting of the digital signals (i.e. the PPROG signal 201, the DATA signal 203, the ADR signal 204 and/or the PWE signal 202) may occur during this step 501. The OTP supply voltage VPP 101 is at read level during step 501, thereby ensuring that the possible (digital) current peaks do not cause VPP peaks which may damage the OTP memory device 320.

In a second step 502, the actual programming of a section of the OTP memory device 320 (wherein the section is identified by the ADR signal 204) is performed. By way of example, a byte of the OTP memory device 320 may be programmed. For this purpose, the OTP supply voltage VPP 101 is increased from the read level to the programming level. The controller 330 may be configured to ensure that the time interval 411, 211 for programming, i.e. the time interval during which the OTP supply voltage VPP 101 is at programming level, is sufficiently long to ensure a reliable programming of the portion of the OTP memory device 320. In particular, it may be ensured that this time interval corresponds to (at least) the programming time interval 211 (which is used, when controlling the programming of the OTP memory device 320 via the PWE signal 202). Typically no digital activities occur in the second step 502. In particular, the digital signals (i.e. the PPROG signal 201, the DATA signal 203, the ADR signal 204 and/or the PWE signal 202) may not be modified, while the OTP supply voltage VPP 101 is at programming level. By doing this, it can be ensured that the OTP memory device 320 does not generate current peaks (i.e. load transients).

In step 503, the next programming cycle is prepared. As such, the sequence 500 recommences at step 501, until the programming of the OTP memory device 320 is completed.

As outlined in the context of FIG. 2a, the programming pulse (comprising an OTP supply voltage VPP 101 at programming level and a load current 102 comprising the fixed PROG component 103 and the bit-dependent component 104 as shown in FIG. 1) may be activated only subsequent to providing the OTP supply voltage VPP 101 at programming level (using e.g. the PWE control signal 202). This, however, may lead to significant current spikes originating from the digital logic of the OTP memory device 320. In the present document, it is proposed to increase the OTP supply voltage VPP 101 to the programming level only after setting up the OTP memory device 320. As a result, the ramp-up of the OTP supply voltage VPP 101 and of the regulator (comprising e.g. OPAMP 311) occurs during the programming time interval 411. This may lead to an increased programming time interval 411. It can be shown, however, that the increase in programming time interval is minimal in practice (typically less than 1%).

Figure 6:
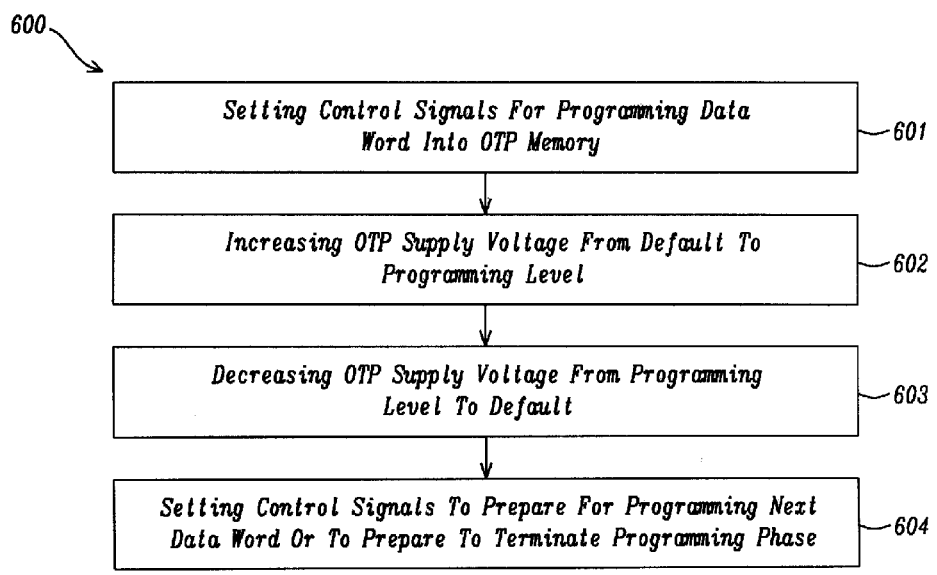
FIG. 6 shows a flow chart of an example method for programming an OTP memory device.

FIG. 6 shows a flow chart of an example method 600 for programming an OTP memory device 320. In particular, FIG. 6 shows a flow chart of an example method 600 for controlling programming of a data word into an OTP memory device 320. The method 600 comprises the step of setting 601 one or more digital control signals 201, 202, 203, 204 for programming the data word into the OTP memory device 320. Furthermore, the method 600 comprises, subsequent to setting 601 the one or more digital control signals, the step of increasing 602 an OTP supply voltage 101 for the OTP memory device 320 from the default operation level to the programming level. Once the OTP supply voltage 101 is being brought up to the programming level, no further modifications may be applied to a logic of the OTP memory device. In particular, the one or more digital control signals 201, 202, 203, 204 may remain unchanged.

The method 600 may further comprise, subsequent to a programming time interval 411, the step of decreasing 603 the OTP supply voltage 101 from the programming level to the default operation level. Only subsequent to decreasing the OTP supply voltage 101, the one or more digital control signals 201, 202, 203, 204 may be modified again (step 604), e.g. in preparation of the programming of the next data word or in order to (logically) terminate the programming phase.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A controller configured to control the programming of a data word into a programmable memory device, wherein the programmable memory device comprises a pin for a pulse width control signal configured to digitally control a default programming time interval for writing the data word into the programmable memory device and a pin for a data signal indicative of the data word which is to be programmed; wherein the controller is configured to set digital control signals for programming the data word into the programmable memory device, wherein the digital control signals comprise the data signal and the pulse width control signal;

subsequent to setting the digital control signals, increase a device supply voltage for the programmable memory device from a default operation level to a programming level;

subsequent to a programming time interval, decrease the device supply voltage from the programming level to the default operation level; and subsequent to decreasing the device supply voltage, reset the pulse width control signal.

2. The controller of claim 1, wherein the controller is further configured to subsequent to decreasing the device supply voltage, modify the one or more digital control signals.

3. The controller of claim 2, wherein the controller is configured to maintain the digital control signals unchanged during the programming time interval.

4. The controller of claim 2, wherein the controller is configured to select the programming time interval, such that an electrical power provided to the programmable memory device within the programming time interval is sufficiently high for programming the code word.

5. The controller of claim 2, wherein the controller is configured to
select the programming time interval to be longer than the default programming time interval;
set the pulse width control signal prior to increasing the device supply voltage.

6. The controller of claim 1, wherein the digital control signals comprise
a data signal indicative of the data word which is to be programmed; and
an address signal indicative of a location within the programmable memory device which is to be programmed.

7. An integrated circuit comprising
a programmable memory device;
a controller configured to control the programming of a data word into the programming memory device, wherein the controller is configured to;
set one or more digital control signals for programming the data word into the programmable memory device;
subsequent to setting the one or more digital control signals, increase a device supply voltage for the programmable memory device from a default operation level to a programming level; and
a device supply voltage provisioning circuit configured to provide a device supply voltage for the programmable memory device at different voltage levels, wherein
the device supply voltage provisioning circuit comprises a voltage regulator configured to derive the device supply voltage from an integrated circuit (IC) supply voltage subject to a reference voltage; and
the controller is configured to set the reference voltage to the programming level
wherein the voltage regulator
comprises an operational amplifier configured to compare at an input of the operational amplifier a feedback voltage which is indicative of the device supply voltage to the reference voltage; and
comprises a pass device controlled by an output of the operational amplifier, wherein the pass device is arranged to couple the IC supply voltage to a device supply voltage pin of the programmable memory device via a variable on-resistance of the pass device wherein the on-resistance of the pass device is controlled by the output of the operational amplifier.

8. The integrated circuit of claim 7, wherein the voltage regulator
is a capacitor-less voltage regulator.

9. The integrated circuit of claim 8, wherein
the voltage regulator comprises an interruption switch configured to decouple the IC supply voltage from the device supply voltage pin; and
the controller is configured to control the interruption switch to decouple the IC supply voltage from the device supply voltage pin to decrease the device supply voltage.

10. The integrated circuit of claim 7, wherein
the device supply voltage provisioning circuit comprises default operation voltage provisioning means configured to provide a device supply voltage at a default operation level; and
the default operation voltage provisioning means are configured to derive the device supply voltage at the default operation level from a logic voltage regulator of the IC.

11. An integrated circuit comprising
a programmable memory device;
a controller configured to control the programming of a data word into a programmable memory device, wherein the controller is configured to
set one or more digital control signals for programming the data word into the programmable memory device;
subsequent to setting the one or more digital control signals, increase a device supply voltage for the programmable memory device from a default operation level to a programming level; and
a device supply voltage provisioning circuit configured to provide a device supply voltage for the programmable memory device at different voltage levels;
wherein
the device supply voltage provisioning circuit comprises a voltage regulator configured to derive the device supply voltage from an integrated circuit (IC) supply voltage, subject to a reference voltage;
the controller is configured to set the reference voltage to the programming level;
the device supply voltage provisioning circuit comprises default operation voltage provisioning means configured to provide a device supply voltage at a default operation level;
the default operation voltage provisioning means are configured to derive the device supply voltage at the default operation level from a logic voltage regulator of the IC;
the default operation voltage provisioning means comprise a resistor for coupling a device supply voltage pin of the programmable memory device with the logic voltage regulator;
the default operation voltage provisioning means comprise a bypass switch in parallel to the resistor, configured to bypass the resistor; and
the controller is configured to control the bypass switch to bypass the resistor for providing the device supply voltage at default operation level.

12. The integrated circuit of claim 10, wherein the controller is configured to control the device supply voltage provisioning circuit such that
a device supply voltage at the default operation level is generated using the default operation voltage provisioning means; and
a device supply voltage at the programming level is generated using the voltage regulator.

13. A method for controlling programming of a data word into a programmable memory device, wherein the method comprises
setting one or more digital control signals for programming the data word into the programmable memory device, wherein the one or more digital control signals comprise a pulse width control signal to digitally control a default programming time interval for programming the data word, wherein the programming time interval is selected such that an electrical power provided to the programmable memory device within the programming time interval is sufficiently high for programming the data word;
subsequent to setting the one or more digital control signals, increasing a device supply voltage for the programmable memory device from a default operation level to a programming level;

subsequent to a programming time interval, decreasing the device supply voltage from the programming level to the default operation level; and subsequent to decreasing the device supply voltage, modifying the one or more digital control signals.

14. The method for controlling programming of a data word into a programmable memory device of claim 13, wherein the controller selects the programming time interval to be longer than the default programming time interval;

sets the pulse width control signal prior to increasing the device supply voltage.

15. The method for controlling programming of a data word into a programmable memory device of claim 13, wherein the digital control signals comprise a data signal indicative of the code word which is to be programmed; and an address signal indicative of a location within the programmable memory device which is to be programmed.

* * * * *